(12) United States Patent
Chen et al.

(10) Patent No.: US 7,249,896 B2
(45) Date of Patent: Jul. 31, 2007

(54) ARRAY OPTICAL SUB-ASSEMBLY

(75) Inventors: Yi-Ming Chen, Hsinchu (TW);
Ying-Chih Chen, Hsinchu (TW);
Yao-Ling Cheng, Hsinchu (TW);
Shun-Tien Lee, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 11/074,733

(22) Filed: Mar. 9, 2005

(65) Prior Publication Data

US 2006/0140550 A1    Jun. 29, 2006

(30) Foreign Application Priority Data

Dec. 24, 2004  (TW) .............................. 93140650 A

(51) Int. Cl.
*G02B 6/36* (2006.01)
*G02B 6/42* (2006.01)
*G02B 6/00* (2006.01)

(52) U.S. Cl. .......................................... 385/92; 385/88
(58) Field of Classification Search .................... None
See application file for complete search history.

(56) References Cited

U.S. PATENT DOCUMENTS

| | | | |
|---|---|---|---|
| 5,249,245 A * | 9/1993 | Lebby et al. ................. 385/89 |
| 6,205,264 B1 * | 3/2001 | Jin et al. ....................... 385/14 |
| 6,525,944 B1 * | 2/2003 | Li ................................ 361/760 |
| 6,550,982 B2 * | 4/2003 | Auburger et al. ............. 385/88 |
| 6,603,915 B2 | 8/2003 | Glebov et al. |
| 6,754,407 B2 | 6/2004 | Chakravorty et al. |
| 6,970,491 B2 * | 11/2005 | Bhandarkar ................. 257/101 |
| 2004/0184495 A1 * | 9/2004 | Kondo ........................ 372/36 |
| 2004/0202428 A1 * | 10/2004 | Hwang et al. ................ 385/49 |
| 2005/0003662 A1 * | 1/2005 | Jursich et al. .............. 438/681 |
| 2005/0152640 A1 * | 7/2005 | Lemoff ........................ 385/24 |

* cited by examiner

*Primary Examiner*—Sung Pak
(74) *Attorney, Agent, or Firm*—Rabin & Berdo, P.C.

(57) ABSTRACT

An array optical sub-assembly includes a base seat, an integrated circuit, a transparent substrate and a photoelectric element. The integrated circuit and the photoelectric element are bonded respectively to the base seat and the transparent substrate. The base seat and the transparent substrate form a sealed space to protect the elements. The photoelectric element and the integrated circuit are separated to avoid thermal interference between the photoelectric element and the integrated circuit. Therefore total performance is increased and fabrication difficulty is reduced.

11 Claims, 2 Drawing Sheets

ARRAY OPTICAL SUB-ASSEMBLY

FIELD OF THE INVENTION

The invention relates to an array optical sub-assembly and particularly to an array type optical sub-assembly that aims to facilitate manufacturing and production, and improve the optical coupling efficiency of photoelectric devices.

BACKGROUND OF THE INVENTION

To meet the requirements of high-speed broadband communication, optical communication industries that utilize light as a transmission medium have progressed rapidly. Optical fiber applications related to optical communication have also become increasingly important. To achieve the objectives of high-speed optical communication and expanded utilization, low cost optical communication devices and high speed transceiver modules are essential. Moreover, future development of data communication for high performance computers aims to employ optical interconnect to link computer chip sets, modules, circuit boards, base boards, cases and processors, and high speed photons for signal transmission to overcome the bottleneck of bandwidth limitations encountered in electron transmission. As the processing speed of the computer CPU or other chip sets becomes faster, the demand for using photons to transmit data also increases. When computer and communication techniques are coupled, optical connections and optical data communication between them become important issues.

Optical communication elements have to meet the requirements of installation environments that demand slim, light and high reliability. The conventional optical interconnection generally adopts direct coupling between a photoelectric element and an optical waveguide. Such an approach does not produce desired optical coupling efficiency and reliability. Researchers are trying to produce a microlens through a polymer structure to enhance the optical coupling efficiency and element airtight packaging. But alignment of the polymer microlens and other photoelectric elements is difficult.

U.S. Pat. No. 6,754,407 discloses a technique to solder a photoelectric element onto an integrated circuit (IC) through a flip-chip approach. Then the photoelectric element is aligned with an optical waveguide pore of a printed circuit board (PCB) through a flip-chip approach, and soldered on the PCB. The photoelectric element has a lens to increase the optical coupling efficiency with the waveguide of the PCB. Such a technique can reduce metal wiring on the PCB, improve signal transmission quality, and reduce the fabrication difficulty of embedding holographic optical elements (HOE) in the PCB waveguide, to serve as the optical signal transmission path and increase usage flexibility. However, such a technique involves soldering the photoelectric element directly onto the IC. When the IC is in operation, the heat generated by the IC is transferred directly to the photoelectric elements and impairs signal transmission quality. The technique also does not deal with how to package the integrated IC and photoelectric elements. Packaging to meet reliability requirements is also a challenge.

U.S. Pat. No. 6,603,915 discloses an interposer and method for producing a light-guiding structure that forms a waveguide on a circuit substrate and expands the waveguide through oxidation so that the waveguide in the substrate can be coupled directly with the photoelectric elements integrated on the IC without a through HOE or other elements. Thereby metal wiring on the circuit board may be reduced and signal transmission speed and quality increased. However, it also has the same reliability and cooling problems encountered in U.S. Pat. No. 6,754,407.

SUMMARY OF THE INVENTION

In view of the aforesaid problems, the primary object of the invention is to provide an array optical sub-assembly that has a novel structure with a separate photoelectric element and IC to reduce fabrication difficulties and improve overall performance.

In order to achieve the foregoing object, the array optical sub-assembly according to the invention includes a base seat, an IC, a transparent substrate and a photoelectric element. The base seat has a holding surface for holding one or more IC. The IC is mounted onto the holding surface. The transparent substrate covers the holding surface to form a sealed space with the base seat to protect the elements housed in the seal space. The photoelectric element is bonded to one side of the transparent substrate where the seal spaced is formed. The photoelectric element and the IC are spaced by a layer of air to prevent thermal interference between the photoelectric element and the IC. The photoelectric element is electrically connected to the IC through the transparent substrate and the base seat.

In addition, the invention further includes a microlens array on another side of the transparent substrate corresponding to the photoelectric element to increase the optical coupling efficiency of the photoelectric element.

The foregoing, as well as additional objects, features and advantages of the invention will be more readily apparent from the following detailed description, which proceeds with reference to the accompanying drawings.

DESCRIPTION OF THE PREFERRED EMBODIMENT

Figure 1:
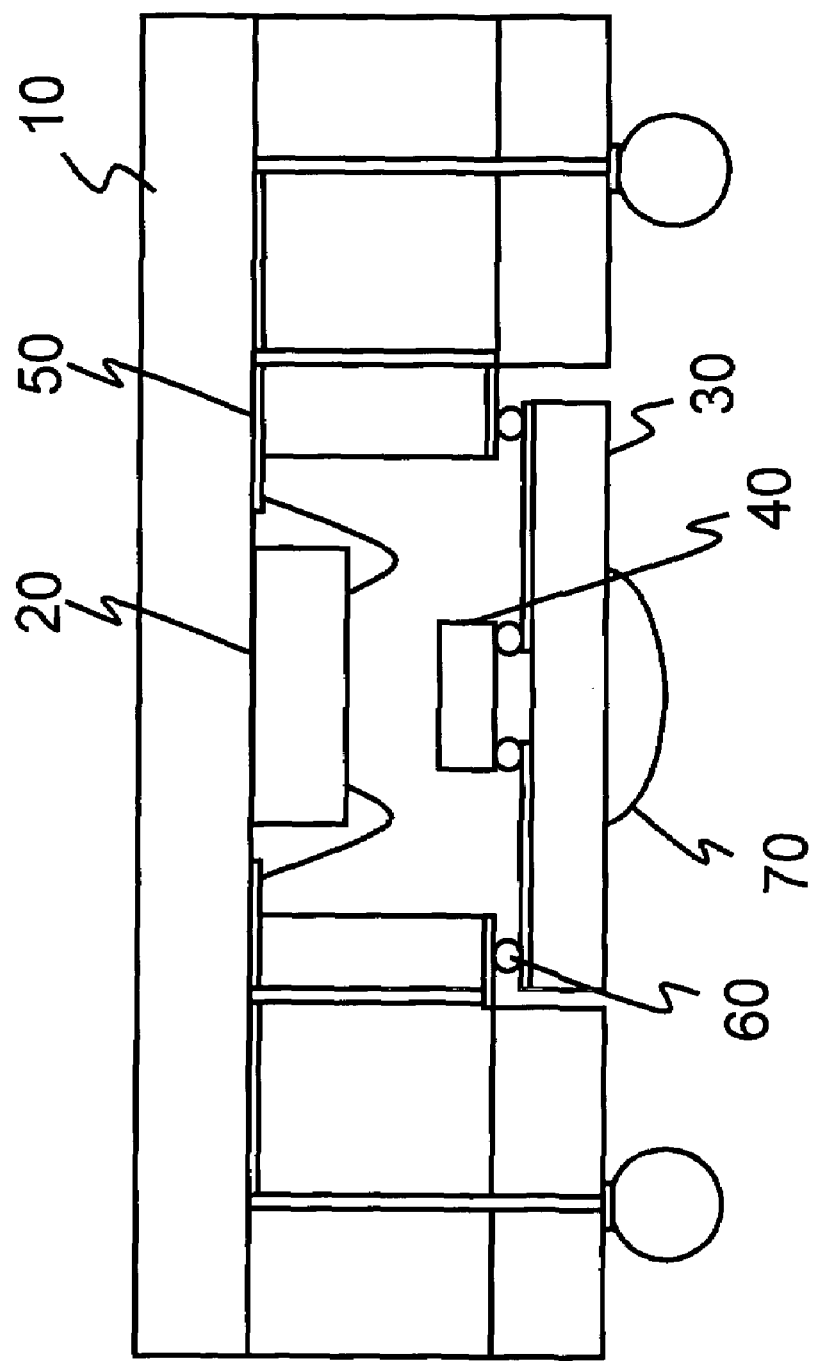
FIG. 1 is a schematic view of an embodiment of the array optical sub-assembly of the invention.

Refer to FIG. 1 for the structure of an embodiment of the array optical sub-assembly of the invention. It includes a base seat 10, an integrated circuit (IC) 20, a transparent substrate 30 and a photoelectric element 40. The base seat 10 has a holding surface for holding the IC 20. The IC 20 is mounted onto the holding surface, and has one or more sets. The transparent substrate 30 is coupled with the photoelectric element 40 and covers the holding surface of the base seat 10 to form a sealed or even airtight space with the base seat 10 to house the photoelectric element 40 and the IC 20. The photoelectric element 40 and the IC 20 are spaced from each other, so heat generated by the IC 20 does not directly transfer to the photoelectric element 40 and cooling problems may be mitigated.

The base seat 10 is made from ceramic material such as aluminum nitride (AlN) and aluminum oxide (Al2O3), or metal, plastics or polymer materials. The base seat 10 has a plurality of metal conductive wires 50. The IC 20 is electrically connected to the metal conductive wires 50 of the base seat 10 by wire bonding. The base seat 10, the transparent substrate 30, and the photoelectric element 40 are bonded through a plurality of solder balls (or silver paste).

The seal or airtight space is formed between the transparent substrate 30 and the base seat 10. The photoelectric element 40 is connected electrically to the IC 20.

The embodiment further has a microlens array 70 bonded to another side of the transparent substrate 30 to enhance the optical coupling efficiency of the photoelectric element 40.

Figure 2:
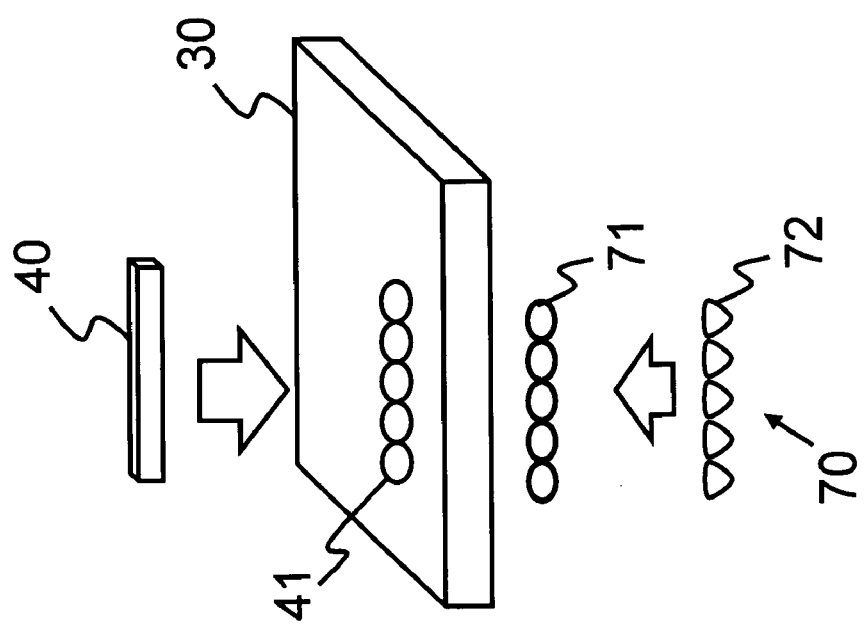
FIG. 2 is a schematic view showing alignment of the photoelectric element and microlens array on the transparent substrate for the embodiment of the invention.

Refer to FIG. 2 for the manufacturing process of the embodiment of the invention. The transparent substrate 30 serves as a carrier. Through a photolithography process, related positioning spots 41 and 71 for the photoelectric element 40 and microlens array 70 are defined, and through a double-side exposure alignment process gold plating lines and signal lines for aligning with the photoelectric element 40 are fabricated. Then the relative position of each microlens 72 is defined to form the precise microlens array 70 on the transparent substrate 30. The relative position of the photoelectric element 40 and the microlens array 70 may also be precisely defined. Then mount the photoelectric element 40 onto the transparent substrate 30 on a flip-chip coupling workstation and finish the alignment at the same time.

As operation of the array optical sub-assembly has to be executed in a closed or airtight environment, the embodiment has the IC 20 and photoelectric element 40 integrated in a ceramic packaging structure. The metal conductive wires 50 are laid on the ceramic base seat 10 to serve as the circuit of the photoelectric element 40 and IC 20, and the packaging process is integrated. The solder balls 60 used in the integration process on the photoelectric element 40 and the transparent substrate 30 are made from a material of a higher temperature, such as AuSn. The solder balls 60 of a lower temperature, such as AgSn, are used for packaging. Finally, the IC 20 and the base seat 10 are bonded together by wire bonding. The photoelectric element 40 and the IC 20 are electrically connected through the solder balls 60 of a lower melting temperature or silver paste.

The embodiment of the invention is tested by a thermal simulation for the thermal distribution of the photoelectric element 40 and the IC 20. Test results indicate that the heat source of the IC 20 is dispersed through the ceramic structure without interfering with the photoelectric element 40. In addition, the alignment of various elements of the embodiment shows that the coupling efficiency between the photoelectric element 40 and the microlens array 70 can reach 47.5%.

In summary, the array optical sub-assembly according to the invention, by integrating the IC and photoelectric element in a closed or airtight structure, can protect the element and mitigate fabrication difficulties. The IC and photoelectric are separated by air, which serves as an insulation layer, and can thus prevent heat generated by the IC from affecting the normal operation of the photoelectric element. Moreover, the microlens array can increase the optical coupling efficiency of the photoelectric element, and bonding is easier between the microlens array and the photoelectric element.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. An array optical sub-assembly, comprising:
   a base seat;
   a transparent substrate parallel with the base seat to form a space therebetween;
   an integrated circuit mounted on a surface of the base seat within the space;
   a photoelectric element mounted on a first side of the transparent substrate within the space and electrically coupled to the integrated circuit, the photoelectric element and the integrated circuit being spaced from each other, such that heat generated by the integrated circuit is not directly transferred to the photoelectric element, and;
   a microlens array located on a second side of the transparent substrate opposite to the photoelectric element to enhance the optical coupling efficiency of the photoelectric element;
   wherein the photoelectric element and the transparent substrate are bonded through a silver paste or solder balls; and
   wherein the base seat has at least one metal conductive wire to serve as a circuit to electrically connect the photoelectric element and the integrated circuit.

2. The array optical sub-assembly of claim 1, wherein the base seat is made from a material selected from the group consisting of ceramics, metal, plastics and polymer materials.

3. The array optical sub-assembly of claim 2, wherein the ceramics are selected from the group consisting of aluminum nitride (AlN) and aluminum oxide ($Al_2O_3$).

4. The array optical sub-assembly of claim 1, wherein the microlens array and the photoelectric element are aligned through a double-side exposure process and bonded to two sides of the transparent substrate.

5. The array optical sub-assembly of claim 1, wherein the integrated circuit is connected electrically to the base seat by wire bonding.

6. The array optical sub-assembly of claim 1, wherein the transparent substrate and the base seat are bonded through a silver paste or solder balls to form the space.

7. The array optical sub-assembly of claim 1, wherein the integrated circuits is connected to the base seat by flip-chip coupling.

8. The array optical sub-assembly of claim 1, wherein the space formed between the base seat and the transparent substrate is a sealed space, wherein the integrated circuit and the photoelectric element are protected.

9. The array optical sub-assembly of claim 8, wherein the sealed space is airtight.

10. The array optical sub-assembly of claim 8, wherein the sealed space contains air, whereby the base seat and the transparent substrate are thermally insulated from each other.

11. The array optical sub-assembly of claim 1, wherein the silver paste or solder balls between the photoelectric element and the transparent substrate have a higher melting temperature than solder balls used for packaging.

* * * * *